United States Patent
Kim et al.

(10) Patent No.: US 9,018,741 B2
(45) Date of Patent: Apr. 28, 2015

(54) SEMICONDUCTOR PACKAGE AND MANUFACTURING METHOD THEREOF

(71) Applicant: Amkor Technology, Inc., Chandler, AZ (US)

(72) Inventors: Dong In Kim, Seoul (KR); Jae Ung Lee, Seoul (KR); Eunnara Cho, Seoul (KR); Min Ju Kim, Seoul (KR)

(73) Assignee: Amkor Technology, Inc.

( * ) Notice: Subject to any disclaimer, the term of this patent is extended or adjusted under 35 U.S.C. 154(b) by 64 days.

(21) Appl. No.: 13/739,565

(22) Filed: Jan. 11, 2013

(65) Prior Publication Data

US 2013/0154066 A1 Jun. 20, 2013

(30) Foreign Application Priority Data

Apr. 12, 2012 (KR) .................. 10-2012-0037724

(51) Int. Cl.
*H01L 23/552* (2006.01)
*H01L 21/50* (2006.01)
*H04R 19/00* (2006.01)
*H04R 19/04* (2006.01)

(52) U.S. Cl.
CPC .............. *H01L 23/552* (2013.01); *H01L 21/50* (2013.01); *H01L 2224/48137* (2013.01); *H01L 2224/48227* (2013.01); *H04R 19/005* (2013.01); *H04R 19/04* (2013.01); *H01L 2924/3025* (2013.01)

(58) Field of Classification Search
None
See application file for complete search history.

(56) References Cited

U.S. PATENT DOCUMENTS

2007/0187818 A1* 8/2007 Lyne .............................. 257/734
2008/0237828 A1* 10/2008 Yang ............................. 257/690

* cited by examiner

*Primary Examiner* — Sonya D McCall Shepard
(74) *Attorney, Agent, or Firm* — McAndrews, Held & Malloy, Ltd.

(57) ABSTRACT

A semiconductor package is presented which has a suitable structure for effectively shielding electromagnetic wave interference (EMI) in a cavity area to which a semiconductor chip is attached. The semiconductor package is assembled such that a lower substrate to which the semiconductor chip is attached is adhered to an EMI shielding & electric I/O body having various types of EMI shielding & electric I/O metal patterns by soldering. Further, the EMI shielding & electric I/O body is adhered to an upper substrate by soldering thereby simplifying assembling of the semiconductor package.

24 Claims, 5 Drawing Sheets

SEMICONDUCTOR PACKAGE AND MANUFACTURING METHOD THEREOF

TECHNICAL FIELD

The present application relates to a semiconductor package, and more particularly, to a semiconductor package, which has a suitable structure for effectively shielding electromagnetic wave interference (EMI) and a manufacturing method thereof.

BACKGROUND

As is well known, when a portable system, such as a mobile phone, a smart phone, a smart pad, a tablet PC, or the like, is operated, EMI is unavoidably generated. Presently, as demands for miniaturized components employed to an electronic product increase, the EMI may adversely affect adjacent components, thereby deteriorating characteristics of the electronic product.

To overcome the disadvantage, a semiconductor package employing an EMI shielding structure is generally used. A typical example of conventional semiconductor packages is shown in FIG. 1.

FIG. 1 is a cross-sectional view of a conventional semiconductor package. As illustrated in FIG. 1, a semiconductor chip 104 such as a microphone, an active element 106, and the like are attached to a predetermined position on a substrate 102, that is, a cavity area 103. The semiconductor chip 104, the active element 106, and a circuit pattern (not shown) of the substrate 102 are electrically connected to one another through a metal wire. Here, reference numeral 108 denotes a sound channel (or sound groove).

In addition, a side surface structure 110 defining the cavity area 103 is adhered onto the substrate 102 through an epoxy resin or an adhesive film, and an upper structure 112 trapping the cavity area 103 is adhered to a top portion of the side surface structure 110 using an adhesive agent, such as an epoxy resin or a film, thereby sealing the resultant structure.

In order to establish an electrical connection, a via hole 114 is formed to completely pass through the side surface structure 110 and is connected to the upper structure using a metal paste of, for example, copper (Cu). Here, the via hole 114 provides an EMI shielding function and electric signal transfer function.

The aforementioned conventional semiconductor package is manufactured by preparing the substrate 102 having the cavity area 103, to which the semiconductor chip 104, the active element 106, and the like, are attached, adhering the side surface structure 110 to a predetermined position of the substrate 102 using an adhesive agent, and adhering the upper structure 112 on the side surface structure 110 using the adhesive agent.

Here, before adhering the side surface structure 110 to the upper structure 112, the adhesive agent is perforated by laser drilling, and the via hole 114 is completely filled with a metal paste by performing a plating process or a screen printing process, thereby establishing the electrical connection when the side surface structure 110 is adhered to the upper structure 112.

In the conventional semiconductor package, holes should be formed on the substrate by drilling before adhering the side surface structure 110 to the upper structure 112, and the formed via holes should be filled with a metal paste, making a semiconductor package assembling work complicated.

BRIEF DESCRIPTION OF THE DRAWINGS

Common reference numerals are used throughout the drawings and the detailed description to indicate the same elements.

DETAILED DESCRIPTION

Figure 1:
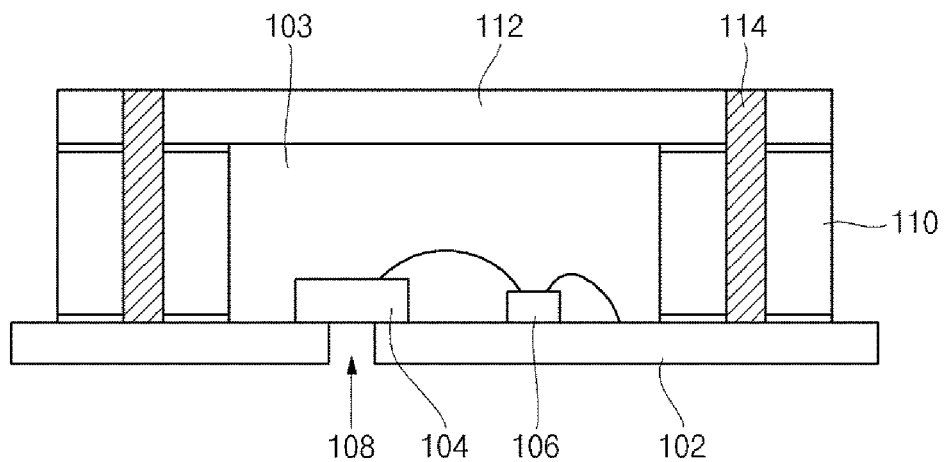
FIG. 1 is a cross-sectional view of a conventional semiconductor package.
Figure 2:
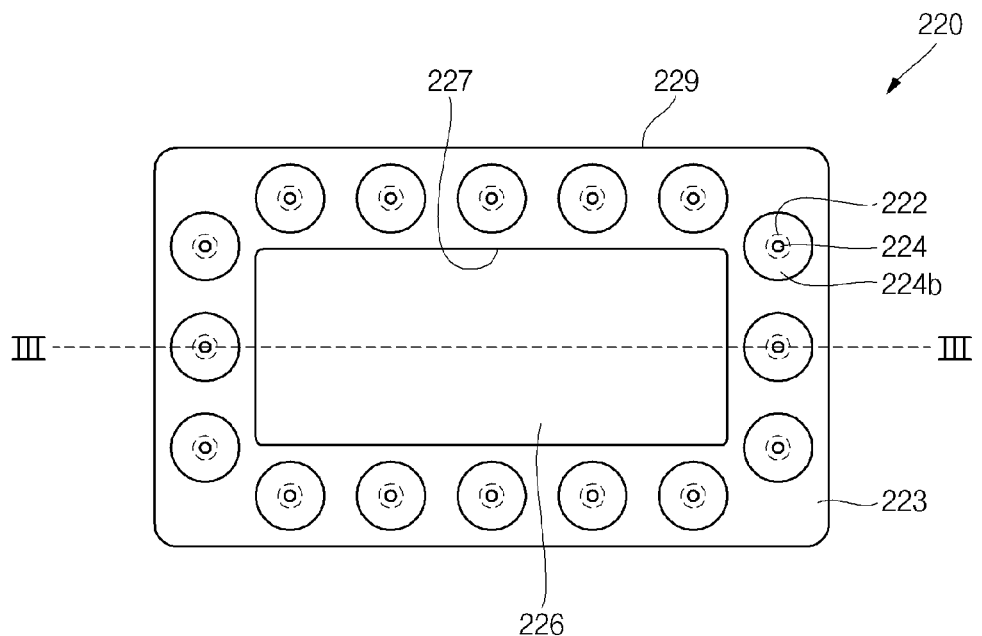
FIG. 2 is a plan view of an EMI shielding & electric I/O body employed to a semiconductor package according to an embodiment.
Figure 3:
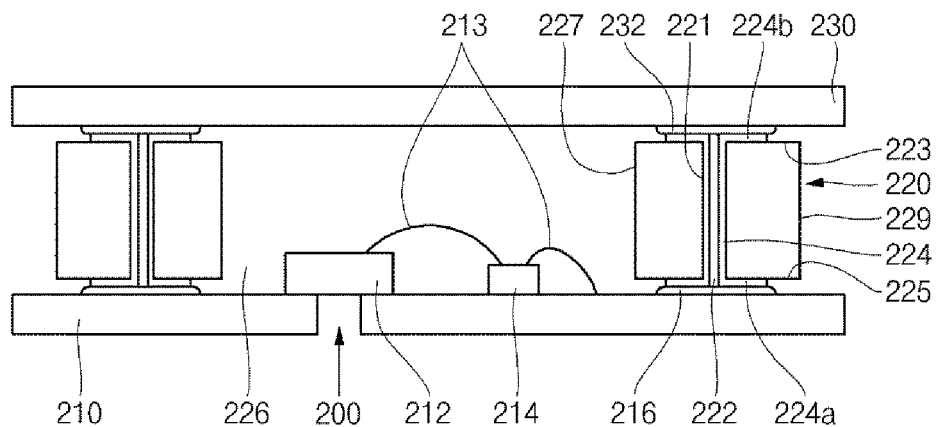
FIG. 3 is a cross-sectional view of the semiconductor package along the line III-III of FIG. 2 according to an embodiment.

FIG. 2 is a plan view of an electromagnetic wave interference (EMI) shielding & electric input/output (I/O) body employed to a semiconductor package according to an embodiment. FIG. 3 is a cross-sectional view of the semiconductor package along the line III-III of FIG. 2 according to an embodiment.

Referring to FIGS. 2 and 3 together, an EMI shielding & electric I/O body 220 employed to a semiconductor package according to an embodiment is adhered between a lower substrate 210 and an upper substrate 230 by soldering using a solder paste, as shown in FIG. 3, to define a cavity area 226 of the lower substrate 210 to which a semiconductor chip 212, an active element 214, and the like, are attached.

The EMI shielding & electric I/O body 220 includes a top portion 223, sometimes called a top surface, and an opposite bottom portion 225, sometimes called a bottom surface. The top portion 223 is parallel to the bottom portion 225.

The EMI shielding & electric I/O body 220 further includes inner sidewalls 227, sometimes called inner surfaces, and outer sidewalls 229, sometimes called outer surfaces. The inner sidewalls 227 face inward and define at least a part of the cavity area 226. The outer sidewalls 229 face outwards and away from the cavity area 226. In one embodiment, the inner sidewalls 227 and the outer sidewalls 229 are parallel to one another. Further, the inner sidewalls 227 and the outer sidewalls 229 are perpendicular to the top portion 223 and the bottom portion 225 and extend therebetween.

Although various features may be described as parallel, perpendicular, or having other relationships, in light of this disclosure, those of skill in the art will understand that the various features may not be exactly parallel and perpendicular, but only substantially parallel and perpendicular, e.g., to within accepted manufacturing tolerances.

An EMI shielding & electric I/O hole 222 completely passing through top and bottom portions 223, 225 of the EMI shielding & electric I/O body 220 is formed inside of the EMI shielding & electric I/O body 220. The EMI shielding & electric I/O hole 222 may include a plurality of EMI shielding & electric I/O holes arranged in constant intervals in the EMI shielding & electric I/O body 220 and may be formed by drilling.

In order to show a plane of the EMI shielding & electric I/O body 220 better in FIG. 2, a detailed view of the EMI shielding & electric I/O body 220 is not shown. However, when the EMI shielding & electric I/O body 220 is adhered to the lower substrate 210 and the upper substrate 230, a semiconductor chip 212, an active element 214 and the like are accommodated in the cavity area 226 of the EMI shielding & electric I/O body 220. In a state in which the lower substrate 210, the EMI shielding & electric I/O body 220 and the upper substrate 230 are adhered to one another, as described above, a section view taken along the line III-III is illustrated in FIG. 3.

Referring to FIG. 3, a plurality of EMI shielding & electric I/O holes 222 passing through top and bottom portions 223, 225 of the EMI shielding & electric I/O body 220 are formed in the EMI shielding & electric I/O body 220. The EMI shielding & electric I/O holes 222 are defined by inner walls 221. The EMI shielding & electric I/O metal patterns 224 are formed through, sometimes called on, inner walls 221 of the EMI shielding & electric I/O holes 222 and portions of the top and bottom portions 223, 225 of the EMI shielding & electric I/O body 220. A metal pattern portion extending to a bottom portion 225 of the EMI shielding & electric I/O body 220 is defined as and functions as a lower metal pattern 224a, and a metal pattern portion extending to a top portion 223 of the EMI shielding & electric I/O body 220 is defined as and functions as an upper metal pattern 224b. Here, the EMI shielding & electric I/O metal patterns 224 may be made of, for example, copper (Cu) or gold (Au) and may be formed by electroplating. In addition, the EMI shielding & electric I/O metal patterns 224 allow for sealing and electrical I/O connection effects.

The lower metal pattern 224a extending to the bottom portion 225 of the EMI shielding & electric I/O body 220 is electrically/physically adhered to a circuit pattern (not shown) of the lower substrate 210 by soldering using a solder paste 216, and the upper metal pattern 224b extending to the top portion 223 of the EMI shielding & electric I/O body 220 is electrically/physically adhered to a circuit pattern (not shown) of the upper substrate 230 by soldering using a solder paste 232.

Here, the circuit pattern on the lower substrate 210 may be electrically connected to the semiconductor chip 212, the active element 214, and/or other elements through a metal wire 213, thereby allowing the metal patterns 224 to function as I/O pads through the connection structure. In FIG. 3, a sound channel 200 (or sound groove) through which external sound is induced to the semiconductor chip 212 is formed in the lower substrate 210. The semiconductor chip 212 may be, for example, a microphone chip.

The EMI shielding & electric I/O hole 222 having the EMI shielding & electric I/O metal pattern 224 formed along its inner wall 221 may be filled with a filler such as a conductive paste (e.g., a copper (Cu) paste) or a non-conductive material (e.g., ink) or may remain unfilled as a hollow space, which is selected in consideration of the need, use, purpose and conditions of the semiconductor package. The filling of the EMI shielding & electric I/O hole 222 with a filler (a conductive material or non-conductive material) may be achieved by dispensing using, for example, underfill equipment.

More particularly, the EMI shielding & electric I/O hole 222 is only partially filled with the EMI shielding & electric I/O metal pattern 224 such that a space exists within the EMI shielding & electric I/O hole 222. The space is sometimes called the EMI shielding & electric I/O hole 222 having the EMI shielding & electric I/O metal pattern 224 formed along its inner wall. The space may be filled on not as discussed above.

Next, sequential processing steps of a manufacturing method of the aforementioned semiconductor package will be described in detail with reference to FIG. 3.

Referring to FIG. 3, the lower substrate 210 attached to a cavity area 226 having at least one semiconductor chip 212 and an active element 214 defined therein in advance is prepared. The semiconductor chip 212 and the active element 214 may be electrically connected through a metal wire 213 or through a physical connection between a chip or device pad (not shown) and a circuit pattern (not shown) on the lower substrate 210.

Next, the EMI shielding & electric I/O body 220 is prepared. That is to say, the EMI shielding & electric I/O hole 222 completely passing through the top and bottom portions 223, 225 of the EMI shielding & electric I/O body 220 is formed inside of the EMI shielding & electric I/O body 220, and the EMI shielding & electric I/O metal patterns 224 are formed through the inner walls 221 of the EMI shielding & electric I/O holes 222 and the portions of the top and bottom portions 223, 225 of the EMI shielding & electric I/O body 220. The metal pattern portion extending to the bottom portion 225 of the EMI shielding & electric I/O body 220 is defined as the lower metal pattern 224a, and the metal pattern portion extending to the top portion 223 of the EMI shielding & electric I/O body 220 is defined as the upper metal pattern 224b. In such a way, the EMI shielding & electric I/O body 220 is prepared.

The aforementioned EMI shielding & electric I/O body 220 may be formed by forming a desired circuit pattern formed at opposite sides of its inner layer, and welding a high-temperature insulator to the opposite sides of the inner structure having the circuit pattern, followed by drilling, thereby forming a plurality of EMI shielding & electric I/O holes 222 (or holes for interlayer connection) passing through top and bottom portions 223, 225 of the EMI shielding & electric I/O body 220. In addition, electroplating is performed, thereby simultaneously forming the EMI shielding & electric I/O metal patterns 224 extending to the inner walls 221 of the EMI shielding & electric I/O holes 222 and the top and bottom portions 223, 225 of the EMI shielding & electric I/O body 220 and the lower and upper metal patterns 224a and 224b. Here, metal patterns materials existing on the top and bottom portions 223, 225 of the EMI shielding & electric I/O body 220, except for the lower and upper metal patterns 224a and 224b, may be selectively removed by a general metal etching process that is well known in the art.

The EMI shielding & electric I/O hole 222 having the EMI shielding & electric I/O metal pattern 224 formed along its inner wall 221 may be filled with a filler such as a conductive paste or a non-conductive material or may remain unfilled as a hollow space. In the filling of the EMI shielding & electric I/O hole 222, a copper (Cu) paste (a conductive paste) or ink (a non-conductive paste) may be used as the filler. Here, the EMI shielding & electric I/O metal patterns 224, which are formed by electroplating, may be made of, for example, copper (Cu) or gold (Au). Here, when the EMI shielding & electric I/O hole 222 is filled with a non-conductive material, a metal capping layer may further be formed on the EMI shielding & electric I/O hole 222.

Next, a lower solder paste 216, which becomes solder after soldering, is applied to a corresponding position of the lower substrate 210, and the EMI shielding & electric I/O body 220 is aligned at a target position of the lower substrate 210, followed by soldering, thereby adhering the EMI shielding & electric I/O body 220 to the lower substrate 210 by attaching the lower metal pattern 224a formed at the bottom portion 225 of the EMI shielding & electric I/O body 220 to the circuit pattern (not shown) on the lower substrate 210.

Then, an upper solder paste 232, which becomes solder after soldering, is applied to a corresponding position of the upper substrate 230, and the EMI shielding & electric I/O body 220 is aligned such that the solder paste 232 faces the upper metal pattern 224b formed at the top portion 223 of the EMI shielding & electric I/O body 220, followed by soldering, thereby adhering the EMI shielding & electric I/O body 220 to the upper substrate 230 by attaching the upper metal pattern 224b to the circuit pattern (not shown) on the upper substrate 230.

Meanwhile, assuming that the EMI shielding & electric I/O hole 222 formed in the EMI shielding & electric I/O body 220 is not filled with a conductive paste or a non-conductive material, according to the current embodiment, before the upper substrate 230 is adhered to the EMI shielding & electric I/O body 220, the EMI shielding & electric I/O hole 222 may first be filled with a conductive paste or a non-conductive material. The filling of the EMI shielding & electric I/O hole 222 may be achieved by dispensing using, for example, underfill equipment.

Figure 4:
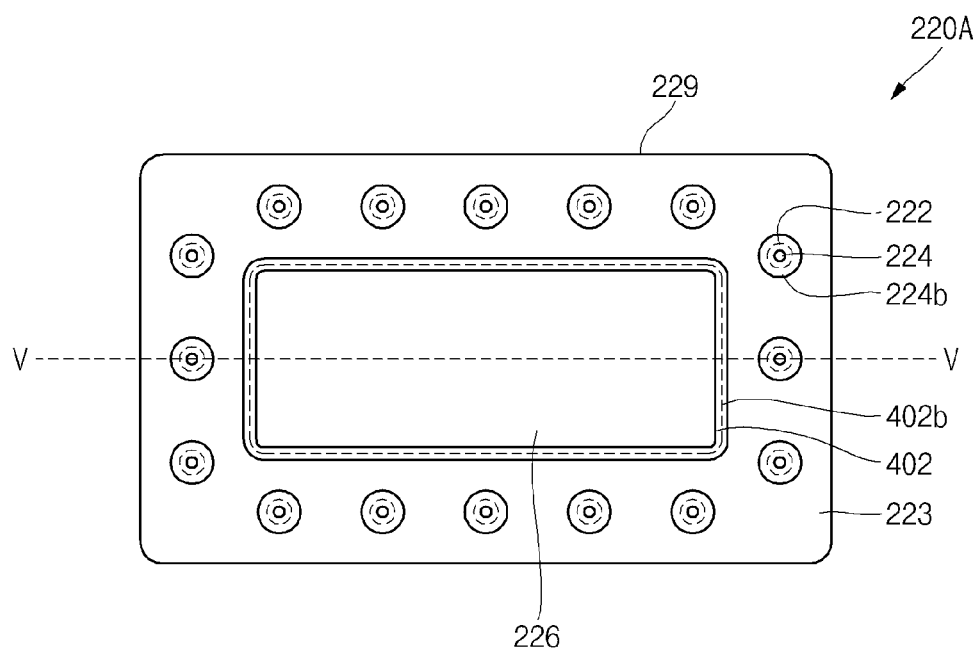
FIG. 4 is a plan view of an EMI shielding & electric I/O body employed to a semiconductor package according to another embodiment.
Figure 5:
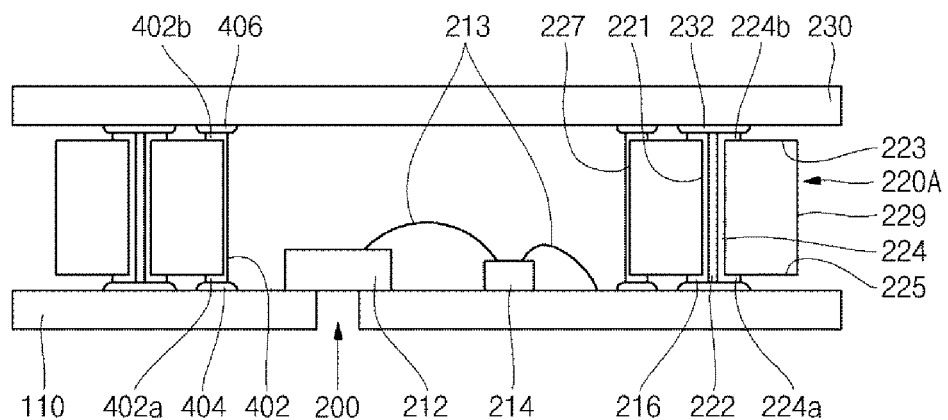
FIG. 5 is a cross-sectional view of the semiconductor package along the line V-V of FIG. 4 according to another embodiment.

FIG. 4 is a plan view of an EMI shielding & electric I/O body employed to a semiconductor package according to another embodiment. FIG. 5 is a cross-sectional view of the semiconductor package along the line V-V of FIG. 4 according to another embodiment.

Referring to FIG. 4, the semiconductor package according to another embodiment is substantially the same as that according to the previous embodiment shown in FIGS. 2 and 3 in view of configurations and components, except that a second EMI shielding & electric I/O metal pattern 402 is further formed through inner sidewalls 227 of an EMI shielding & electric I/O body 220A facing a cavity area 226 and portions of top and bottom portions 223, 225 of the EMI shielding & electric I/O body 220A. Therefore, in order to avoid duplicated description, the following description will focus on a first metal pattern 224 and a second metal pattern 402.

Referring to FIG. 5, the EMI shielding & electric I/O body 220A employed to the semiconductor package according to another embodiment includes a plurality of EMI shielding & electric I/O holes 222 passing through top and bottom portions 223, 225 of the EMI shielding & electric I/O body 220A, a first EMI shielding & electric I/O metal pattern 224 formed through the inner wall of the EMI shielding & electric I/O hole 222 and the top and bottom portions 223, 225 of the EMI shielding & electric I/O body 220A. A first metal pattern portion extending to a bottom portion 225 of the EMI shielding & electric I/O body 220A is defined as a first lower metal pattern 224a, and a first metal pattern portion extending to a top portion 223 of the EMI shielding & electric I/O body 220A is defined as a first upper metal pattern 224b.

In addition, the EMI shielding & electric I/O body 220A of the present embodiment includes a second EMI shielding & electric I/O metal pattern 402 formed through an inner sidewall 227 facing the cavity area 226. In one embodiment, the second EMI shielding & electric I/O metal pattern 402 is formed on the entire inner sidewalls 227. A second metal pattern portion extending to a bottom portion 225 of the EMI shielding & electric I/O body 220A is defined as a second lower metal pattern 402a, and a second metal pattern portion extending to a top portion 223 of the EMI shielding & electric I/O body 220A is defined as a second upper metal pattern 402b. Here, the second EMI shielding & electric I/O metal pattern 402 may be made of, for example, copper (Cu) or gold (Au) and may be formed by electroplating, like the first EMI shielding & electric I/O metal pattern 224.

In addition, the first lower metal pattern 224a and the second lower metal pattern 402a extending to the bottom portion 225 of the EMI shielding & electric I/O body 220A are electrically or physically adhered to a circuit pattern (not shown) of a lower substrate 210 or a surface corresponding thereto by soldering using a solder paste 216 and a solder paste 404. The first upper metal pattern 224b and the second upper metal pattern 402b extending to the top portion 223 of the EMI shielding & electric I/O body 220A are electrically or physically adhered to a circuit pattern (not shown) of an upper substrate 230 or a surface corresponding thereto by soldering using a solder paste 232 and a solder paste 406.

Next, sequential processing steps of a manufacturing method of the aforementioned semiconductor package will be described in detail with reference to FIG. 5.

Referring to FIG. 5, the lower substrate 210 attached to a cavity area 226 having at least one semiconductor chip 212 and an active element 214 defined therein in advance is prepared. The semiconductor chip 212 and the active element 214 may be electrically connected through a metal wire 213 or through a physical connection between a chip or device pad (not shown) and a circuit pattern (not shown) on the lower substrate 210.

Next, the EMI shielding & electric I/O body 220A is prepared. That is to say, the EMI shielding & electric I/O hole 222 completely passing through the top and bottom portions 223, 225 of the EMI shielding & electric I/O body 220A is formed inside of the EMI shielding & electric I/O body 220A, and the first EMI shielding & electric I/O metal patterns 224 are formed through the inner walls 221 of the EMI shielding & electric I/O holes 222 and the portions of the top and bottom portions 223, 225 of the EMI shielding & electric I/O body 220A. The first metal pattern portion extending to the bottom portion of the EMI shielding & electric I/O body 220A is defined as the first lower metal pattern 224a, and the first metal pattern portion extending to the top portion 223 of the EMI shielding & electric I/O body 220A is defined as the first upper metal pattern 224b. The second metal pattern portion extending to the bottom portion 225 of the EMI shielding & electric I/O body 220A is defined as the second lower metal pattern 402a, and the second metal pattern portion extending to the top portion 223 of the EMI shielding & electric I/O body 220A is defined as the second upper metal pattern 402b. In such a way, the EMI shielding & electric I/O body 220A is prepared.

The aforementioned EMI shielding & electric I/O body 220A may be formed by forming a desired circuit pattern formed at opposite sides of its inner layer, and welding a high-temperature insulator to the opposite sides of the inner structure having the circuit pattern, followed by drilling, thereby forming a plurality of EMI shielding & electric I/O holes 222 (or holes for interlayer connection) passing through top and bottom portions 223, 225 of the EMI shielding & electric I/O body 220A. In addition, electroplating is performed, thereby simultaneously forming the first EMI shielding & electric I/O metal patterns 224 extending to the inner walls 221 of the EMI shielding & electric I/O holes 222 and the top and bottom portions 223, 225 of the EMI shielding & electric I/O body 220A, the first lower and upper metal patterns 224a and 224b, the second EMI shielding & electric I/O metal patterns 402 extending along the inner sidewall 227 of the EMI shielding & electric I/O body 220A and to portions of the top and bottom portions 223, 225 of the EMI shielding & electric I/O body 220A, and the second lower and upper metal patterns 402a and 402b. Here, metal patterns materials existing on the top and bottom portions 223, 225 of the EMI shielding & electric I/O body 220A, except for the first lower and upper metal patterns 224a and 224b and the second lower and upper metal patterns 402a and 402b, may be selectively removed by a general metal etching process that is well known in the art.

The EMI shielding & electric I/O hole 222 having the EMI shielding & electric I/O metal pattern 224 formed along its inner wall 221 may be filled with a filler such as a conductive paste or a non-conductive material or may remain unfilled as a hollow space. In the filling of the EMI shielding & electric I/O hole 222, a copper (Cu) paste (a conductive paste) or ink (a non-conductive paste) may be used as the filler. Here, the EMI shielding & electric I/O metal patterns 224, which are formed by electroplating, may be made of, for example, copper (Cu) or gold (Au). Here, when the EMI shielding & electric I/O hole 222 is filled with a non-conductive material, a metal capping layer may further be formed on the EMI shielding & electric I/O hole 222.

Next, a solder paste 216 is applied to a corresponding position of the lower substrate 210, and the EMI shielding & electric I/O body 220A is aligned at a target position of the lower substrate 210, followed by soldering, thereby adhering the EMI shielding & electric I/O body 220A to the lower substrate 210 by attaching the first lower metal pattern 224a formed at the bottom portion 225 of the EMI shielding & electric I/O body 220A and the second lower metal pattern 402a to the circuit pattern (not shown) on the lower substrate 210.

Then, a solder paste 232 and a solder paste 406 are applied to corresponding positions of the upper substrate 230, and the EMI shielding & electric I/O body 220A is aligned such that the solder paste 232 and the solder paste 406 face the first and second upper metal patterns 224b and 402b formed on the EMI shielding & electric I/O body 220A, followed by soldering, thereby adhering the EMI shielding & electric I/O body 220A to the upper substrate 230 by attaching the first and second upper metal patterns 224b and 402b to the circuit patterns (not shown) on the upper substrate 230.

Meanwhile, assuming that the EMI shielding & electric I/O hole 222 formed in the EMI shielding & electric I/O body 220A is not filled with a conductive paste or a non-conductive material, according to the current embodiment, before the upper substrate 230 is adhered to the EMI shielding & electric I/O body 220A, the EMI shielding & electric I/O hole 222 may first be filled with a conductive paste or a non-conductive material. The filling of the EMI shielding & electric I/O hole 222 may be achieved by dispensing using, for example, underfill equipment.

Therefore, compared to the semiconductor package according to the first embodiment, the semiconductor package according to this embodiment further includes the second EMI shielding & electric I/O metal pattern extending portions of the top and bottom portions of the EMI shielding & electric I/O body along the sidewall of the EMI shielding & electric I/O body facing the cavity area. Therefore, the semiconductor package according to this embodiment allow for sealing and electrical I/O connection effects with maximum efficiency.

Figure 6:
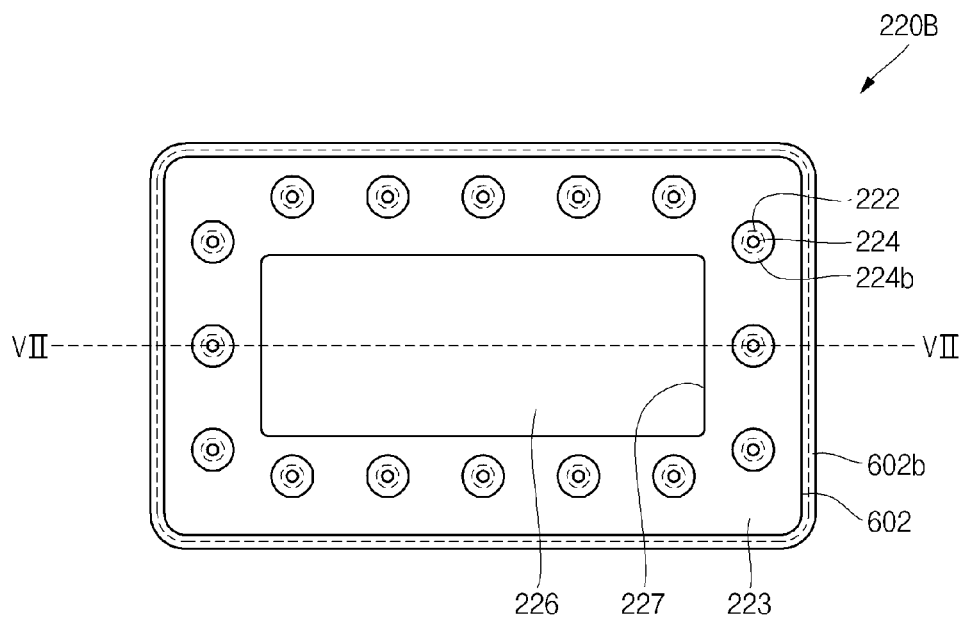
FIG. 6 is a plan view of an EMI shielding & electric I/O body employed to a semiconductor package according to still another embodiment.
Figure 7:
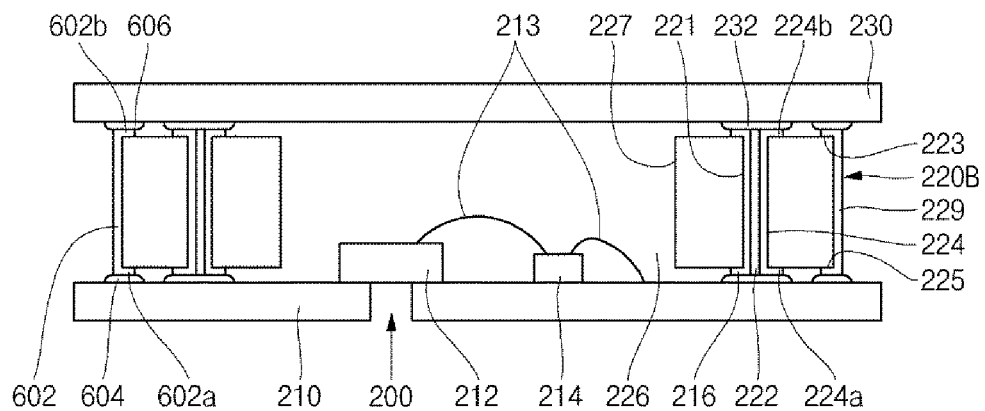
FIG. 7 is a cross-sectional view of the semiconductor package along the line VII-VII of FIG. 6 according to still another embodiment.

FIG. 6 is a plan view of an EMI shielding & electric I/O body employed to a semiconductor package according to still another embodiment. FIG. 7 is a cross-sectional view of the semiconductor package along the line VII-VII of FIG. 6 according to still another embodiment.

Referring to FIG. 6, the semiconductor package according to still another embodiment is substantially the same as that according to the previous embodiment shown in FIGS. 2 and 3 in view of configurations and components, except that a second EMI shielding & electric I/O metal pattern 602 is further formed through outer sidewalls 229 of an EMI shielding & electric I/O body 220B facing a cavity area 226 and portions of top and bottom portions 223, 225 of the EMI shielding & electric I/O body 220B. Therefore, in order to avoid duplicated description, the following description will focus on a first metal pattern 224 and a second metal pattern 602.

Referring to FIG. 7, the EMI shielding & electric I/O body 220B employed to the semiconductor package according to another embodiment includes a plurality of EMI shielding & electric I/O holes 222 passing through top and bottom portions 223, 225 of the EMI shielding & electric I/O body 220B, a first EMI shielding & electric I/O metal pattern 224 formed through the inner wall of the EMI shielding & electric I/O hole 222 and the top and bottom portions 223, 225 of the EMI shielding & electric I/O body 220B. A first metal pattern portion extending to a bottom portion 225 of the EMI shielding & electric I/O body 220B is defined as a first lower metal pattern 224a, and a first metal pattern portion extending to a top portion 223 of the EMI shielding & electric I/O body 220B is defined as a first upper metal pattern 224b.

In addition, the EMI shielding & electric I/O body 220B of the present embodiment includes a second EMI shielding & electric I/O metal pattern 602 formed through an outer sidewall 229 back-facing the cavity area 226. In one embodiment, the second EMI shielding & electric I/O metal pattern 602 is formed on the entire outer sidewalls 229. A second metal pattern portion extending to a bottom portion 225 of the EMI shielding & electric I/O body 220B is defined as a second lower metal pattern 602a, and a second metal pattern portion extending to a top portion 223 of the EMI shielding & electric I/O body 220B is defined as a second upper metal pattern 602b. Here, the second EMI shielding & electric I/O metal pattern 602 may be made of, for example, copper (Cu) or gold (Au), like the first EMI shielding & electric I/O metal pattern 224, and may be formed at the same time with first EMI shielding & electric I/O metal patterns 224 by electroplating.

In addition, the first lower metal pattern 224a and the second lower metal pattern 602a extending to the bottom portion 225 of the EMI shielding & electric I/O body 220B are electrically or physically adhered to a circuit pattern (not shown) of a lower substrate 210 or a surface corresponding thereto by soldering using a solder paste 216 and a solder paste 604. The first upper metal pattern 224b and the second upper metal pattern 602b extending to the top portion 223 of the EMI shielding & electric I/O body 220B are electrically or physically adhered to a circuit pattern (not shown) of an upper substrate 230 or a surface corresponding thereto by soldering using a solder paste 232 and a solder paste 606.

Next, sequential processing steps of a manufacturing method of the aforementioned semiconductor package will be described in detail with reference to FIG. 7.

Referring to FIG. 7, the lower substrate 210 attached to a cavity area 226 having at least one semiconductor chip 212 and an active element 214 defined therein in advance is prepared. The semiconductor chip 212 and the active element 214 may be electrically connected through a metal wire 213 or through a physical connection between a chip or device pad (not shown) and a circuit pattern (not shown) on the lower substrate 210.

Next, the EMI shielding & electric I/O body 220B is prepared. That is to say, the EMI shielding & electric I/O hole 222 completely passing through the top and bottom portions 223, 225 of the EMI shielding & electric I/O body 220B is formed inside of the EMI shielding & electric I/O body 220B, and the first EMI shielding & electric I/O metal patterns 224 are formed through the inner walls 221 of the EMI shielding & electric I/O holes 222 and the portions of the top and bottom portions 223, 225 of the EMI shielding & electric I/O body 220B. The first metal pattern portion extending to the bottom portion 225 of the EMI shielding & electric I/O body 220B is defined as the first lower metal pattern 224a, and the first metal pattern portion extending to the top portion 223 of the EMI shielding & electric I/O body 220B is defined as the first upper metal pattern 224b. The second metal pattern portion extending to the bottom portion 225 of the EMI shielding & electric I/O body 220B is defined as the second lower metal pattern 602a, and the second metal pattern portion extending to the top portion 223 of the EMI shielding & electric I/O body 220B is defined as the second upper metal pattern 602b. In such a way, the EMI shielding & electric I/O body 220B is prepared.

The aforementioned EMI shielding & electric I/O body 220B may be formed by forming a desired circuit pattern formed at opposite sides of its inner layer, and welding a high-temperature insulator to the opposite sides of the inner structure having the circuit pattern, followed by drilling, thereby forming a plurality of EMI shielding & electric I/O holes 222 (or holes for interlayer connection) passing through top and bottom portions 223, 225 of the EMI shielding & electric I/O body 220B. In addition, electroplating is performed, thereby simultaneously forming the first EMI shielding & electric I/O metal patterns 224 extending to the inner walls 221 of the EMI shielding & electric I/O holes 222 and the top and bottom portions 223, 225 of the EMI shielding & electric I/O body 220B, the first lower and upper metal patterns 224a and 224b, the second EMI shielding & electric I/O metal patterns 602 extending along the inner sidewall 227 of the EMI shielding & electric I/O body 220B and to portions of the top and bottom portions 223, 225 of the EMI shielding & electric I/O body 220B, and the second lower and upper metal patterns 602a and 602b. Here, metal patterns materials existing on the top and bottom portions 223, 225 of the EMI shielding & electric I/O body 220B, except for the first lower and upper metal patterns 224a and 224b and the second lower and upper metal patterns 602a and 602b, may be selectively removed by a general metal etching process that is well known in the art.

The EMI shielding & electric I/O hole 222 having the EMI shielding & electric I/O metal pattern 224 formed along its inner wall 221 may be filled with a filler such as a conductive paste or a non-conductive material or may remain unfilled as a hollow space. In the filling of the EMI shielding & electric I/O hole 222, a copper (Cu) paste (a conductive paste) or ink (a non-conductive paste) may be used as the filler. Here, the EMI shielding & electric I/O metal patterns 224, which are formed by electroplating, may be made of, for example, copper (Cu) or gold (Au). Here, when the EMI shielding & electric I/O hole 222 is filled with a non-conductive material, a metal capping layer may further be formed on the EMI shielding & electric I/O hole 222.

Next, a solder paste 216 and a solder paste 604 are applied to corresponding positions of the lower substrate 210, and the EMI shielding & electric I/O body 220B is aligned at a target position of the lower substrate 210, followed by soldering, thereby adhering the EMI shielding & electric I/O body 220B to the lower substrate 210 by attaching the first lower metal pattern 224a formed at the bottom portion 225 of the EMI shielding & electric I/O body 220B and the second lower metal pattern 602a to the circuit pattern (not shown) on the lower substrate 210.

Then, a solder paste 232 and a solder paste 606 are applied to corresponding positions of the upper substrate 230, and the EMI shielding & electric I/O body 220B is aligned such that the solder paste 232 and the solder paste 606 face the first and second upper metal patterns 224b and 602b formed on the EMI shielding & electric I/O body 220B, followed by soldering, thereby adhering the EMI shielding & electric I/O body 220B to the upper substrate 230 by attaching the first and second upper metal patterns 224b and 602b to the circuit patterns (not shown) on the upper substrate 230.

Meanwhile, assuming that the EMI shielding & electric I/O hole 222 formed in the EMI shielding & electric I/O body 220B is not filled with a conductive paste or a non-conductive material, according to the current embodiment, before the upper substrate 230 is adhered to the EMI shielding & electric I/O body 220B, the EMI shielding & electric I/O hole 222 may first be filled with a conductive paste or a non-conductive material. The filling of the EMI shielding & electric I/O hole 222 may be achieved by dispensing using, for example, underfill equipment.

Therefore, compared to the semiconductor package according to the first embodiment, the semiconductor package according to this embodiment further includes the second EMI shielding & electric I/O metal pattern extending portions of the top and bottom portions of the EMI shielding & electric I/O body along the sidewall of the EMI shielding & electric I/O body facing the cavity area. Therefore, the semiconductor package according to this embodiment allow for sealing and electrical I/O connection effects with maximum efficiency.

Figure 8:
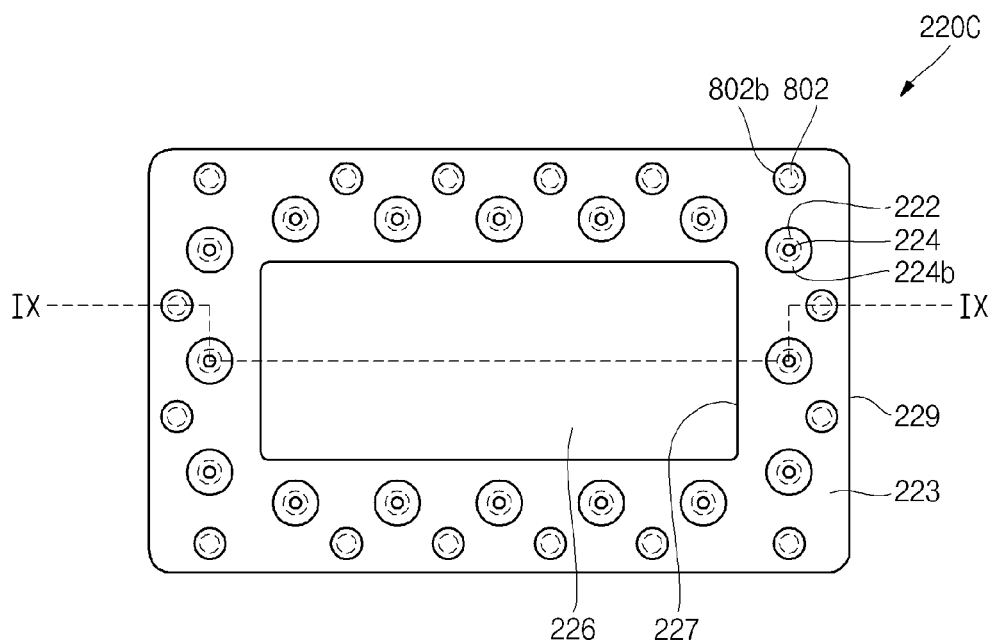
FIG. 8 is a plan view of an EMI shielding & electric I/O body employed to a semiconductor package according to still another embodiment.
Figure 9:
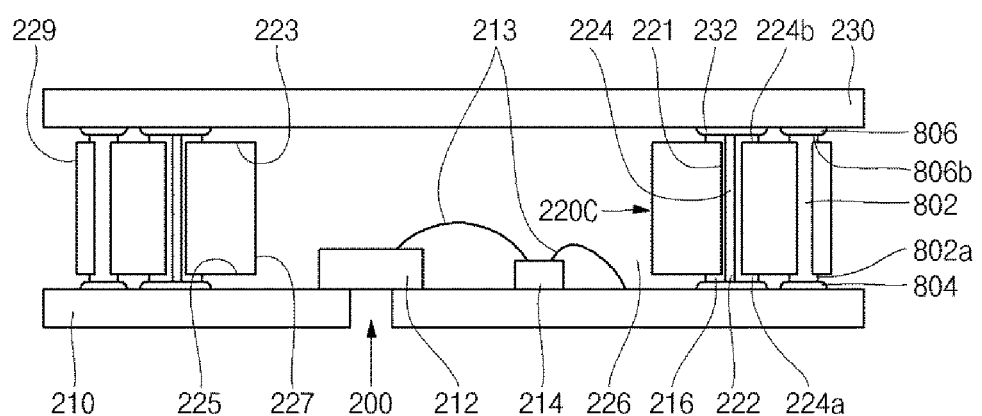
FIG. 9 is a cross-sectional view of the semiconductor package along the line IX-IX of FIG. 8 according to still another embodiment.

FIG. 8 is a plan view of an EMI shielding & electric I/O body employed to a semiconductor package according to still another embodiment. FIG. 9 is a cross-sectional view of the semiconductor package along the line IX-IX of FIG. 8 according to still another embodiment.

Referring to FIG. 8, the semiconductor package according to still another embodiment is substantially the same as that according to the previous embodiment shown in FIGS. 2 and 3 in view of configurations and components, except that a plurality of second EMI shielding & electric I/O holes passing through top and bottom portions 223, 225 of an EMI shielding & electric I/O body 220C from the outside back-facing a cavity area 226 in view of a plurality of first EMI shielding & electric I/O holes 222 are formed and the second EMI shielding & electric I/O metal pattern 802 having the second EMI shielding & electric I/O holes filled with a conductive paste is further formed. Therefore, in order to avoid duplicated description, the following description will focus on a first EMI shielding & electric I/O metal pattern 224 and a second EMI shielding & electric I/O metal pattern 802.

Here, the plurality of second EMI shielding & electric I/O holes are arranged to cross the plurality of first EMI shielding & electric I/O holes 222 in a horizontal or vertical direction, respectively, which is for the purpose of increasing EMI shielding & electric I/O performance.

Referring to FIG. 9, the EMI shielding & electric I/O body 220C employed to the semiconductor package according to still another embodiment includes a plurality of first EMI shielding & electric I/O holes 222 passing through top and bottom portions 223, 225 of the EMI shielding & electric I/O body 220C, the first EMI shielding & electric I/O metal pattern 224 formed through the inner wall 221 of the EMI shielding & electric I/O hole 222 and the top and bottom portions 223, 225 of the EMI shielding & electric I/O body 220C. A first metal pattern portion extending to a bottom portion 225 of the EMI shielding & electric I/O body 220C is defined as a first lower metal pattern 224a, and a first metal pattern portion extending to a top portion 223 of the EMI shielding & electric I/O body 220C is defined as a first upper metal pattern 224b.

In addition, the plurality of second EMI shielding & electric I/O holes are formed to pass through top and bottom portions 223, 225 of an EMI shielding & electric I/O body 220C from the outside back-facing the cavity area 226 in view of the plurality of first EMI shielding & electric I/O holes 222, and the second EMI shielding & electric I/O metal pattern 802 having the second EMI shielding & electric I/O holes filled with a conductive paste is further formed. A second metal pattern portion extending to a bottom portion 225 of the EMI shielding & electric I/O body 220C is defined as a second lower metal pattern 802a, and a second metal pattern portion extending to a top portion 223 of the EMI shielding & electric I/O body 220C is defined as a second upper metal pattern 802b. Here, the second EMI shielding & electric I/O metal pattern 802 may be made of, for example, copper (Cu) or gold (Au), like the first EMI shielding & electric I/O metal patterns 224, and may be formed at the same time with first EMI shielding & electric I/O metal patterns 224 by electroplating. Alternatively, the second EMI shielding & electric I/O metal pattern 802 may also be formed by filling a conductive paste by dispensing using underfill equipment.

In addition, the first lower metal pattern 224a and the second lower metal pattern 802a extending to the bottom portion 225 of the EMI shielding & electric I/O body 220C are electrically or physically adhered to a circuit pattern (not shown) of a lower substrate 210 or a surface corresponding thereto by soldering using a solder paste 216 and a solder paste 804. The first upper metal pattern 224b and the second upper metal pattern 802b extending to the top portion 223 of the EMI shielding & electric I/O body 220C are electrically or physically adhered to a circuit pattern (not shown) of an upper substrate 230 or a surface corresponding thereto by soldering using a solder paste 232 and a solder paste 806.

Next, sequential processing steps of a manufacturing method of the aforementioned semiconductor package will be described in detail with reference to FIG. 9.

Referring to FIG. 9, the lower substrate 210 attached to a cavity area 226 having at least one semiconductor chip 212 and an active element 214 defined therein in advance is prepared. The semiconductor chip 212 and the active element 214 may be electrically connected through a metal wire 213 or through a physical connection between a chip or device pad (not shown) and a circuit pattern (not shown) on the lower substrate 210.

Next, the EMI shielding & electric I/O body 220C is prepared. That is to say, the EMI shielding & electric I/O hole 222 completely passing through the top and bottom portions 223, 225 of the EMI shielding & electric I/O body 220C is formed inside of the EMI shielding & electric I/O body 220C, and the first EMI shielding & electric I/O metal patterns 224 are formed through the inner walls 221 of the EMI shielding & electric I/O holes 222 and the portions of the top and bottom portions 223, 225 of the EMI shielding & electric I/O body 220C. The first metal pattern portion extending to the bottom portion 225 of the EMI shielding & electric I/O body 220C is defined as the first lower metal pattern 224a, and the first metal pattern portion extending to the top portion 223 of the EMI shielding & electric I/O body 220C is defined as the first upper metal pattern 224b. The second EMI shielding & electric I/O metal pattern 802 is formed by filling with a conductive paste the second EMI shielding & electric I/O holes formed to pass through the top and bottom portions 223, 225 of the EMI shielding & electric I/O body 220C from the outside back-facing the cavity area 226 in view of the EMI shielding & electric I/O hole 222. A second metal pattern portion extending to the bottom portion 225 of the EMI shielding & electric I/O body 220C is defined as the second lower metal pattern 802a, and the second metal pattern portion extending to the top portion 223 of the EMI shielding & electric I/O body 220C is defined as the second upper metal pattern 802b. In such a way, the EMI shielding & electric I/O body 220C is prepared.

Here, the second EMI shielding & electric I/O holes may be filled with a conductive paste by, for example, dispensing using underfill equipment, or may be electroplated, thereby forming the second EMI shielding & electric I/O metal pattern 802.

The aforementioned EMI shielding & electric I/O body 220C may be formed by forming a desired circuit pattern formed at opposite sides of its inner layer, and welding a high-temperature insulator to the opposite sides of the inner structure having the circuit pattern, followed by drilling, thereby forming a plurality of EMI shielding & electric I/O holes 222 (or holes for interlayer connection) passing through top and bottom portions 223, 225 of the EMI shielding & electric I/O body 220C. In addition, electroplating may be performed, thereby simultaneously forming the EMI shielding & electric I/O metal patterns 224 extending to the inner walls 221 of the EMI shielding & electric I/O holes 222 and the top and bottom portions 223, 225 of the EMI shielding & electric I/O body 220C, the second EMI shielding & electric I/O metal pattern 802 formed by filling a conductive paste and passing through top and bottom portions 223, 225 of an EMI shielding & electric I/O body 220C from the outside back-facing a cavity area 226 in view of a plurality of first EMI shielding & electric I/O holes 222, and the second lower and upper metal patterns 802a and 802b. Here, metal patterns materials existing on the top and bottom portions 223, 225 of the EMI shielding & electric I/O body 220C, except for the first lower and upper metal patterns 224a and 224b and the second lower and upper metal patterns 802a and 802b, may be selectively removed by a general metal etching process that is well known in the art.

The EMI shielding & electric I/O hole 222 having the EMI shielding & electric I/O metal pattern 224 formed along its inner wall 221 may be filled with a filler such as a conductive paste or a non-conductive material or may remain unfilled as a hollow space. In the filling of the EMI shielding & electric I/O hole 222, a copper (Cu) paste (a conductive paste) or ink (a non-conductive paste) may be used as the filler. Here, the EMI shielding & electric I/O metal patterns 224, which are formed by electroplating, may be made of, for example, copper (Cu) or gold (Au). Here, when the EMI shielding & electric I/O hole 222 is filled with a non-conductive material, a metal capping layer may further be formed on the EMI shielding & electric I/O hole 222.

Next, a solder paste 216 and a solder paste 804 are applied to corresponding positions of the lower substrate 210, and the EMI shielding & electric I/O body 220C is aligned at a target position of the lower substrate 210, followed by soldering, thereby adhering the EMI shielding & electric I/O body 220C to the lower substrate 210 by attaching the first and second lower metal patterns 224a and 802a formed at the bottom portion 225 of the EMI shielding & electric I/O body 220C to the circuit pattern (not shown) on the lower substrate 210.

Then, a solder paste 232 and a solder paste 806 are applied to corresponding positions of the upper substrate 230, and the EMI shielding & electric I/O body 220C is aligned such that the solder paste 232 and the solder paste 806 face the first and second upper metal patterns 224b and 802b formed at the top portion 223 of the EMI shielding & electric I/O body 220C, followed by soldering, thereby adhering the EMI shielding & electric I/O body 220C to the upper substrate 230 by attaching the first and second upper metal patterns 224b and 802b to the circuit pattern (not shown) on the upper substrate 230.

Meanwhile, assuming that the EMI shielding & electric I/O hole 222 formed in the EMI shielding & electric I/O body 220C is not filled with a conductive paste or a non-conductive material, according to the current embodiment, before the upper substrate 230 is adhered to the EMI shielding & electric I/O body 220C, the EMI shielding & electric I/O hole 222 may first be filled with a conductive paste or a non-conductive material. The filling of the EMI shielding & electric I/O hole 222 may be achieved by dispensing using, for example, underfill equipment.

Therefore, compared to the semiconductor package according to the first embodiment, the semiconductor package according to this embodiment further includes the second EMI shielding & electric I/O metal pattern formed by filling with a conductive paste the plurality of second EMI shielding & electric I/O holes passing through top and bottom portions of an EMI shielding & electric I/O body from the outside back-facing the cavity area in view of a plurality of first EMI shielding & electric I/O holes. Therefore, the semiconductor package according to this embodiment allow for sealing and electrical I/O connection effects with maximum efficiency.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor package comprising:
a lower substrate;
a semiconductor chip coupled to a cavity area of the lower substrate;
an electromagnetic wave interference (EMI) shielding & electric input/output (I/O) body formed to surround the cavity area and coupled to the lower substrate; and
an upper substrate coupled to the EMI shielding & electric I/O body,
wherein the EMI shielding & electric I/O body comprises:
an EMI shielding & electric I/O hole formed to pass through top and bottom portions of the EMI shielding & electric I/O body; and
a first EMI shielding & electric I/O metal pattern coupled to an inner wall of the EMI shielding & electric I/O hole and portions of the top and bottom portions of the EMI shielding & electric I/O body, and comprising a first lower metal pattern coupled to the lower substrate and a first upper metal pattern coupled to the upper substrate,
and wherein the EMI shielding & electric I/O hole is one of a plurality of EMI shielding & electric I/O holes arranged in constant intervals in the EMI shielding & electric I/O body.

2. The semiconductor package of claim 1, wherein the EMI shielding & electric I/O hole is one of at least three EMI shielding & electric I/O holes arranged in constant intervals in the EMI shielding & electric I/O body.

3. The semiconductor package of claim 1, wherein the EMI shielding & electric I/O body further comprises a filler that fills at least a portion of the inside of the EMI shielding & electric I/O hole.

4. The semiconductor package of claim 3, wherein the filler comprises a non-conductive material.

5. The semiconductor package of claim 1 further comprising a second EMI shielding & electric I/O metal pattern coupled to outer sidewalls and portions of the top and bottom portions of the EMI shielding & electric I/O body.

6. The semiconductor package of claim 1, further comprising a first solder coupling the first lower metal pattern to the lower substrate, and a second solder coupling the first upper metal pattern to the upper substrate.

7. The semiconductor package of claim 5, wherein the second EMI shielding & electric I/O metal pattern includes a second lower metal pattern coupled to a corresponding surface of the lower substrate, and a second upper metal pattern coupled to a corresponding surface of the upper substrate.

8. A semiconductor package comprising:
a lower substrate;
a semiconductor chip coupled to a cavity area of the lower substrate;
an electromagnetic wave interference (EMI) shielding & electric input/output (I/O) body formed to surround the cavity area and coupled to the lower substrate; and
an upper substrate coupled to the EMI shielding & electric I/O body,
wherein the EMI shielding & electric I/O body comprises:
an EMI shielding & electric I/O hole formed to pass through top and bottom portions of the EMI shielding & electric I/O body; and
a first EMI shielding & electric I/O metal pattern coupled to an inner wall of the EMI shielding & electric I/O hole and portions of the top and bottom portions of the EMI shielding & electric I/O body, and comprising a first lower metal pattern coupled to the lower substrate and a first upper metal pattern coupled to the upper substrate; and
further comprising a second EMI shielding & electric I/O metal pattern coupled to outer sidewalls back-facing the cavity area and portions of the top and bottom portions of the EMI shielding & electric I/O body.

9. The semiconductor package of claim 8, wherein the second EMI shielding & electric I/O metal pattern comprises a second lower metal pattern coupled to a corresponding surface of the lower substrate, and a second upper metal pattern coupled to a corresponding surface of the upper substrate.

10. The semiconductor package of claim 8, wherein the EMI shielding & electric I/O body further comprises a filler that fills at least a portion of the inside of the EMI shielding & electric I/O hole.

11. The semiconductor package of claim 10, wherein the filler comprises a non-conductive material.

12. A semiconductor package comprising:
a lower substrate;
a semiconductor chip coupled to a cavity area of the lower substrate;
an electromagnetic wave interference (EMI) shielding & electric input/output (I/O) body formed to surround the cavity area and coupled to the lower substrate; and
an upper substrate coupled to the EMI shielding & electric I/O body,
wherein the EMI shielding & electric I/O body comprises:
a first EMI shielding & electric I/O hole formed to pass through top and bottom portions of the EMI shielding & electric I/O body;
a first EMI shielding & electric I/O metal pattern coupled to an inner wall of the EMI shielding & electric I/O hole and portions of the top and bottom portions of the EMI shielding & electric I/O body and comprising a first lower metal pattern coupled to the lower substrate, and a first upper metal pattern coupled to the upper substrate;
a second EMI shielding & electric I/O hole; and
a second EMI shielding & electric I/O metal pattern comprising conductive paste filling the second EMI shielding & electric I/O hole, the second EMI shielding & electric I/O metal pattern further comprising a second lower metal pattern coupled to the lower substrate and a second upper metal pattern coupled to the upper substrate,
wherein the first and second EMI shielding & electric I/O holes are two of a plurality of first and second EMI shielding & electric I/O holes arranged in constant intervals in the EMI shielding & electric I/O body.

13. The semiconductor package of claim 12, wherein the first EMI shielding & electric I/O hole is one of a plurality of first EMI shielding & electric I/O holes arranged in constant intervals in the EMI shielding & electric I/O body, and the second EMI shielding & electric I/O hole is one of a plurality of second EMI shielding & electric I/O holes arranged in constant intervals in the EMI shielding & electric I/O body.

14. The semiconductor package of claim 13, wherein the plurality of second EMI shielding & electric I/O holes are arranged to cross the plurality of first EMI shielding & electric I/O holes.

15. The semiconductor package of claim 13, wherein the plurality of second EMI shielding & electric I/O holes are formed at the outside back-facing the cavity area in view of the first EMI shielding & electric I/O holes.

16. A semiconductor package comprising:
a lower substrate;
an electromagnetic wave interference (EMI) shielding & electric input/output (I/O) body comprising:
a top surface;
a bottom surface;
inner sidewalls defining a cavity;
outer sidewalls;
a first EMI shielding & electric I/O hole extending through the EMI shielding & electric I/O body from the top surface to the bottom surface; and
a first EMI shielding & electric I/O metal pattern at least partially filling the first EMI shielding & electric I/O hole, the first EMI shielding & electric I/O metal pattern comprising:
a first lower metal pattern coupled to the bottom surface; and
a first upper metal pattern coupled to the top surface;
a first lower solder coupling the first lower metal pattern to the lower substrate;
an upper substrate; and
a first upper solder coupling the first upper metal pattern to the upper substrate.

17. The substrate of claim 16 wherein the EMI shielding & electric I/O body further comprises:
a second EMI shielding & electric I/O metal pattern coupled to the outer sidewalls, the second EMI shielding & electric I/O metal pattern comprising:
a second lower metal pattern coupled to the bottom surface; and
a second upper metal pattern coupled to the top surface;
a second lower solder coupling the second lower metal pattern to the lower substrate; and
a second upper solder coupling the second upper metal pattern to the upper substrate.

18. The substrate of claim 17 wherein the second EMI shielding & electric I/O metal pattern is coupled to the entire outer sidewalls.

19. The substrate of claim 16 wherein the EMI shielding & electric I/O body further comprises:
a second EMI shielding & electric I/O metal pattern coupled to the inner sidewalls, the second EMI shielding & electric I/O metal pattern comprising:
a second lower metal pattern coupled to the bottom surface; and
a second upper metal pattern coupled to the top surface;
a second lower solder coupling the second lower metal pattern to the lower substrate; and
a second upper solder coupling the second upper metal pattern to the upper substrate.

20. The substrate of claim 19 wherein the second EMI shielding & electric I/O metal pattern is coupled to the entire inner sidewalls.

21. The semiconductor package of claim 8, wherein the second EMI shielding & electric I/O metal pattern covers the entire outer sidewalls.

22. The semiconductor package of claim 8, wherein the first and second EMI shielding & electric I/O metal patterns are both plated with a same plating layer.

23. The semiconductor package of claim 12, wherein the second EMI shielding & electric I/O metal pattern covers the entire outer sidewalls.

24. The semiconductor package of claim 12, wherein the first and second EMI shielding & electric I/O metal patterns are both plated with a same plating layer.

* * * * *